(12) United States Patent
Lee et al.

(10) Patent No.: US 10,741,631 B2
(45) Date of Patent: Aug. 11, 2020

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Kwanghoon Lee, Yongin-si (KR); Mugyeom Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/181,254

(22) Filed: Nov. 5, 2018

(65) Prior Publication Data

US 2019/0074345 A1    Mar. 7, 2019

Related U.S. Application Data

(62) Division of application No. 14/885,828, filed on Oct. 16, 2015, now Pat. No. 10,121,842.

(30) Foreign Application Priority Data

Dec. 26, 2014  (KR) .................. 10-2014-0191126

(51) Int. Cl.
*H01L 27/32*    (2006.01)
*H01L 51/52*    (2006.01)
*H01L 51/00*    (2006.01)
*H01L 27/12*    (2006.01)

(52) U.S. Cl.
CPC ........ *H01L 27/3276* (2013.01); *H01L 27/124* (2013.01); *H01L 27/1255* (2013.01); *H01L 51/0097* (2013.01); *H01L 51/5256* (2013.01); *H01L 27/3246* (2013.01); *H01L 51/52* (2013.01); *H01L 2227/323* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 6,410,942 B1 | 6/2002 | Thibeault et al. |
| 7,495,736 B2 | 2/2009 | Chen et al. |
| 9,257,669 B2 | 2/2016 | Ke et al. |
| 9,972,663 B2 | 5/2018 | Shin et al. |

(Continued)

FOREIGN PATENT DOCUMENTS

| | | |
|---|---|---|
| CN | 101185175 A | 5/2008 |
| CN | 103296054 A | 9/2013 |

(Continued)

*Primary Examiner* — Steven B Gauthier
(74) *Attorney, Agent, or Firm* — Lewis Roca Rothgerber Christie LLP

(57) ABSTRACT

A display device and a method of manufacturing the same are disclosed. In one aspect, the display device includes a substrate including a separation area and a plurality of pixel formed over the substrate. The separation area is formed between adjacent pixels, and a plurality of through holes are respectively defined by a plurality of surrounding inner surfaces of the separation area, and wherein each of the inner surfaces passes through the substrate. The display device also includes an encapsulation layer formed over the substrate and covering the inner surfaces of the separation area.

9 Claims, 14 Drawing Sheets

(56) References Cited

U.S. PATENT DOCUMENTS

| | | | | |
|---|---|---|---|---|
| 2008/0218369 A1* | 9/2008 | Krans | ................... | A47G 9/1045 |
| | | | | 340/691.1 |
| 2010/0073620 A1 | 3/2010 | Yamaguchi et al. | | |
| 2010/0309233 A1 | 12/2010 | Choi | | |
| 2011/0291120 A1 | 12/2011 | Tak et al. | | |
| 2013/0222217 A1* | 8/2013 | Shin | ...................... | H01L 27/326 |
| | | | | 345/80 |
| 2016/0066408 A1 | 3/2016 | Afentakis | | |

FOREIGN PATENT DOCUMENTS

| | | |
|---|---|---|
| CN | 103955089 A | 7/2014 |
| JP | 2002-278466 A | 9/2002 |
| JP | 2008-542834 A | 11/2008 |
| JP | 2010-072380 A | 4/2010 |
| JP | 2014-126574 A | 7/2014 |
| KR | 10-2008-0076554 A | 8/2008 |
| KR | 10-2012-0059946 A | 6/2012 |
| TW | 200705001 A | 2/2007 |
| TW | 200713655 A | 4/2007 |

\* cited by examiner

DISPLAY DEVICE AND METHOD OF MANUFACTURING THE SAME

CROSS-REFERENCE TO RELATED APPLICATIONS

This application is a divisional of U.S. patent application Ser. No. 14/885,828, filed Oct. 16, 2015, which claims priority to and the benefit of Korean Patent Application No. 10-2014-0191126, filed Dec. 26, 2014, the entire content of both of which is incorporated herein by reference.

BACKGROUND

Field

The described technology generally relates to a display device and a method of manufacturing the same.

Description of the Related Technology

The use of display devices is being diversified due to their thin profile and light weight. Existing displays are being replaced by portable and thin flat panel displays. Generally, its thin profile and associated difficulty with manufacturing, causes concerns about the durability of devices. Bending and folding are in high demand, but manufacturing display devices that are both flexible and durable is challenging. For this reason, there are limits in enhancing the user experience with their constraints.

SUMMARY OF CERTAIN INVENTIVE ASPECTS

One inventive aspect relates to a display device and a method of manufacturing the same, which enhance a user's convenience.

Another aspect is a display device that includes: a substrate; a plurality of pixel units that are formed on the substrate; a separation area that is defined on the substrate and are formed between two adjacent pixel units among the plurality of pixel units; a through part that is formed in the separation area and includes an inner surface passing through the substrate; and an encapsulation layer that is formed on the substrate and covers the inner surface of the through part, wherein an organic layer and an inorganic layer are alternately formed in the encapsulation layer to seal the plurality of pixel units.

The inner surface of the through part can have a slope.

The inner surface of the through part can have a step height.

Each of the plurality of pixel units can include: a pixel electrode that is formed on the substrate; an intermediate layer that includes an emission layer formed on the pixel electrode; and an opposite electrode that is formed to be opposite to the pixel electrode and covers the intermediate layer.

The inner surface of the through part can have a width which is narrowed in a direction from the opposite electrode to the substrate.

The separation area can include a first separation area and a second separation area, and the first separation area can include a region between two pixel units, which are adjacent to each other in a first direction, among the plurality of pixel units. The second separation area can include a region between two pixel units, which are adjacent to each other in a second direction intersecting the first direction, among the plurality of pixel units. The through part can include a first through part and a second through part. The first through part can be formed in the first separation area, and the second through part can be formed in the second separation area.

The first through part can have a shape that long extends along the second direction, and the second through part can have a shape that long extends along the first direction.

The display device can further include one or more wirings that are electrically connected to the plurality of pixel units, wherein the one or more wirings are formed not to overlap the through part.

The one or more wirings can extend in one direction and are formed to be curved and to protrude in another direction, intersecting the one direction, along a periphery of the through part which is formed in the other direction intersecting the one direction.

The one or more wirings can include a plurality of wirings, and two wirings, which are adjacent to each other in one direction, among the plurality of wirings can be symmetrical about the through part.

The substrate can have flexibility.

Another aspect is a method of manufacturing a display device that includes: providing a substrate that includes a pixel area in which a plurality of pixel units are formed and a separation area that is formed between two adjacent pixel units among the plurality of pixel units; forming the plurality of pixel units on the substrate; forming a through part, which includes an inner surface passing through the substrate, in the separation area of the substrate; and forming an encapsulation layer, which covers the inner surface of the through part, on the substrate and, wherein an organic layer and an inorganic layer are alternately formed in the encapsulation layer to seal the plurality of pixel units.

The forming of the through part can include forming the inner surface of the through part to have a slope or a step height.

The forming of the plurality of pixel units can include: forming a pixel electrode on the substrate; forming an intermediate layer, which includes an emission layer, on the pixel electrode; and forming an opposite electrode that covers the intermediate layer and is opposite to the pixel electrode.

The forming of the through part can include forming the inner surface of the through part for a width to be narrowed in a direction from the opposite electrode to the substrate.

The method can further include forming a thin film transistor, which includes a semiconductor layer, a gate electrode, a source electrode, and a drain electrode, on the substrate. The forming of the thin film transistor can include: forming a gate insulating layer between the semiconductor layer and the gate electrode; forming an interlayer insulating layer between the gate electrode and the source electrode and drain electrode; and forming a contact hole, which enables the semiconductor layer to be electrically connected to the source electrode and the drain electrode, in the gate insulating layer and the interlayer insulating layer. The forming of the through part can include: forming a first through hole; forming a second through hole; forming a third through hole; and forming a fourth through hole. The forming of the contact hole and the forming of the first through hole can be simultaneously performed.

The method can further include forming a first insulating layer, in which a hole exposing one of the source electrode and drain electrode of the thin film transistor is formed, on the thin film transistor, wherein the forming of the first insulating layer and the forming of the second through hole can be simultaneously performed.

The method can further include forming a second insulating layer, including an opening that exposes a center portion of the pixel electrode, on the first insulating layer, wherein the forming of the second insulating layer and the forming of the third through hole can be simultaneously performed.

The forming of the fourth through hole can include removing a portion of the substrate corresponding to the first through hole to form the fourth through hole.

The providing of the substrate can include forming the substrate with a material having flexibility.

Another aspect is a display device comprising: a substrate including a separation area;

A plurality of pixel formed over the substrate, wherein the separation area is formed between adjacent pixels, wherein a plurality of through holes are respectively defined by a plurality of surrounding inner surfaces of the separation area, and wherein each of the inner surfaces passes through the substrate; and an encapsulation layer formed over the substrate and covering the inner surfaces of the separation area.

In the above display device, at least one of the inner surfaces has a slope.

In the above display device, at least one of the inner surfaces has a step shape.

In the above display device, each of the pixels comprises: a pixel electrode formed over the substrate; an intermediate layer including an emission layer formed over the pixel electrode; and an opposite electrode formed opposite to the pixel electrode and at least partially covering the intermediate layer.

In the above display device, at least one of the inner surfaces has a greater width adjacent to the opposite electrode than the substrate.

The display device of claim 1, wherein the separation area comprises a first separation area and a second separation area, wherein the first separation area comprises a region formed between first pixels, adjacent to each other in a first direction, among the pixels, wherein the second separation area comprises a region formed between second pixels, adjacent to each other in a second direction crossing the first direction, among the pixels, wherein the through hole comprises first and second through holes respectively formed in the first and second separation areas.

In the above display device, the first through hole extends in the second direction, wherein the second through hole extends in the first direction.

The above display device further comprises one or more wirings electrically connected to the pixels, wherein the wirings do not overlap the through hole in a direction crossing the first and second directions.

In the above display device, the wirings extend in one of the first and second directions, wherein the wirings protrude in the other direction so as to curve around a periphery of the through hole.

In the above display device, the wirings comprise a plurality of wirings, wherein two of the wirings, adjacent to each other in one of the first and second directions, are substantially symmetrical with respect to the through hole.

In the above display device, the substrate is flexible.

Another aspect is a method of manufacturing a display device, the method comprising: providing a substrate including a pixel area and a separation area; forming a plurality of pixels in the pixel area, wherein the separation area is located between adjacent pixels; forming a plurality of through holes respectively defined by a plurality of surrounding inner surfaces of the separation area, wherein each of the inner surfaces passes through the substrate; and forming an encapsulation layer over the substrate so as to cover the inner surfaces of the through hole.

In the above method, the forming of the through hole comprises forming at least one of the inner surfaces to have a slope or a step shape.

In the above method, the forming of the pixels comprises: forming a pixel electrode over the substrate; forming an intermediate layer including an emission layer over the pixel electrode; and forming an opposite electrode at least partially covering the intermediate layer and opposite to the pixel electrode.

In the above method, the forming of the through holes comprises forming at least one of the inner surfaces having a greater width adjacent to the opposite electrode than the substrate.

The above method further comprises forming a thin film transistor (TFT), including a semiconductor layer and gate, source and drain electrodes, over the substrate, wherein the forming of the TFT comprises: forming a gate insulating layer between the semiconductor layer and the gate electrode; forming an interlayer insulating layer between the gate and source electrodes and between the gate and drain electrodes; and forming a contact hole, through which the semiconductor layer is electrically connected to the source and drain electrodes, in the gate and interlayer insulating layers, wherein the forming of the through holes comprises forming first to fourth through holes consecutively, and wherein the forming of the contact hole and the forming of the first through hole are concurrently performed.

The above method further comprises forming a first insulating layer over the TFT, wherein the first insulating layer includes a hole exposing one of the source and drain electrodes of the TFT, and wherein the forming of the first insulating layer and the forming of the second through hole are concurrently performed.

The above method further comprises forming a second insulating layer, including an opening that exposes a center portion of the pixel electrode, over the first insulating layer, wherein the forming of the second insulating layer and the forming of the third through hole are concurrently performed.

In the above method, the forming of the fourth through hole comprises removing a portion of the substrate corresponding to the first through hole.

In the above method, at least one of the through holes is formed between four adjacent pixels.

DETAILED DESCRIPTION OF CERTAIN INVENTIVE EMBODIMENTS

Figure 1:
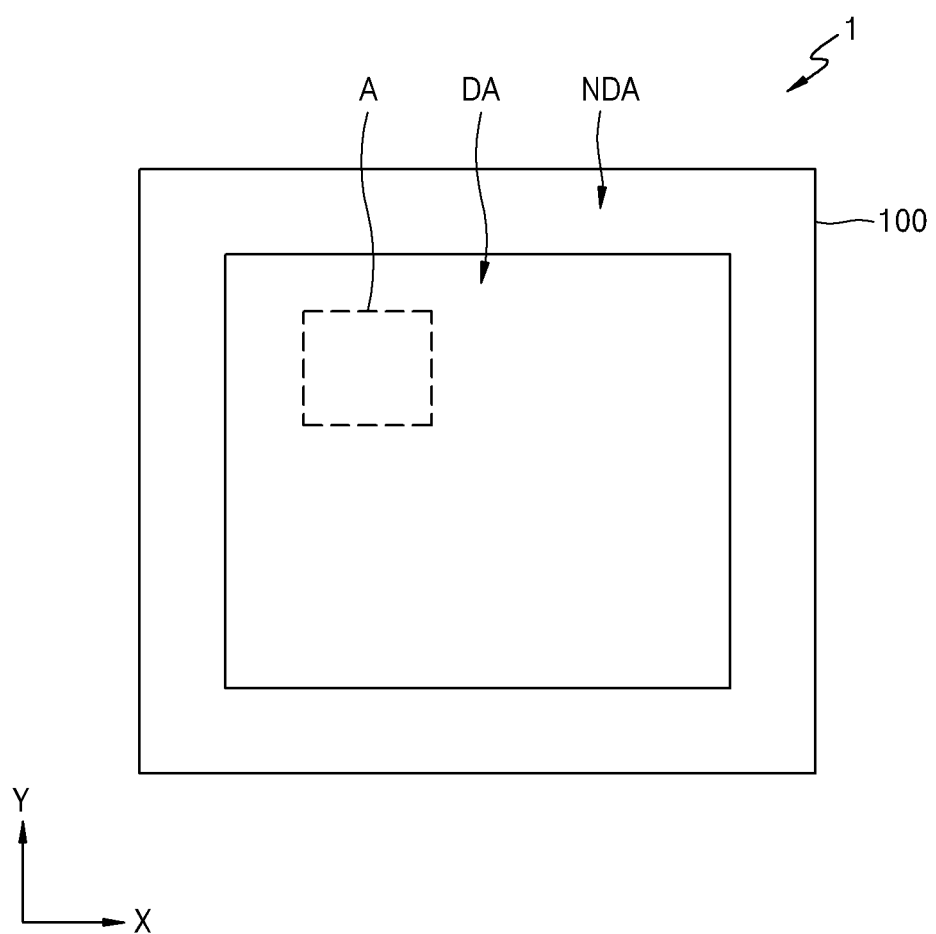
FIG. 1 is a plan view schematically illustrating a display device according to an exemplary embodiment.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description.

Embodiments can impose various transformations that can have various embodiments, and specific embodiments illustrated in the drawings will be described in detail in the detailed description. The effects and features of the described technology will become apparent from the following description of the embodiments with reference to the accompanying drawings, which is set forth hereinafter. The described technology can, however, can be embodied in different forms and should not be construed as being limited to the embodiments set forth herein.

Hereinafter, embodiments of the described technology will be described in detail with reference to the accompanying drawings. In addition, in the present specification and drawings, like reference numerals refer to like elements throughout, and thus, redundant descriptions are omitted.

In the following embodiments, the terms "first" and "second" are for differentiating one element from another element, and these elements should not be limited by these terms. In the following embodiments, the singular forms "a", "an" and "the" are intended to include the plural forms as well, unless the context clearly indicates otherwise.

In the following embodiments, it should be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. Also, when an element such as a layer or a region is referred to as being "on" another element, this includes a case where one element is formed between other elements, in addition to a case where one element is formed directly on the other element.

In the drawings, the dimensions of layers and regions are exaggerated or reduced for clarity of illustration. For example, a dimension and thickness of each element in the drawings are arbitrarily illustrated for clarity, and thus, embodiments of the described technology are not limited thereto.

In the following examples, the x-axis, the y-axis and the z-axis are not limited to three axes of the rectangular coordinate system, and can be interpreted in a broader sense. For example, the x-axis, the y-axis, and the z-axis can be perpendicular to one another, or can represent different directions that are not perpendicular to one another.

When a certain embodiment can be implemented differently, a specific process order can be performed differently from the described order. For example, two consecutively described processes can be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
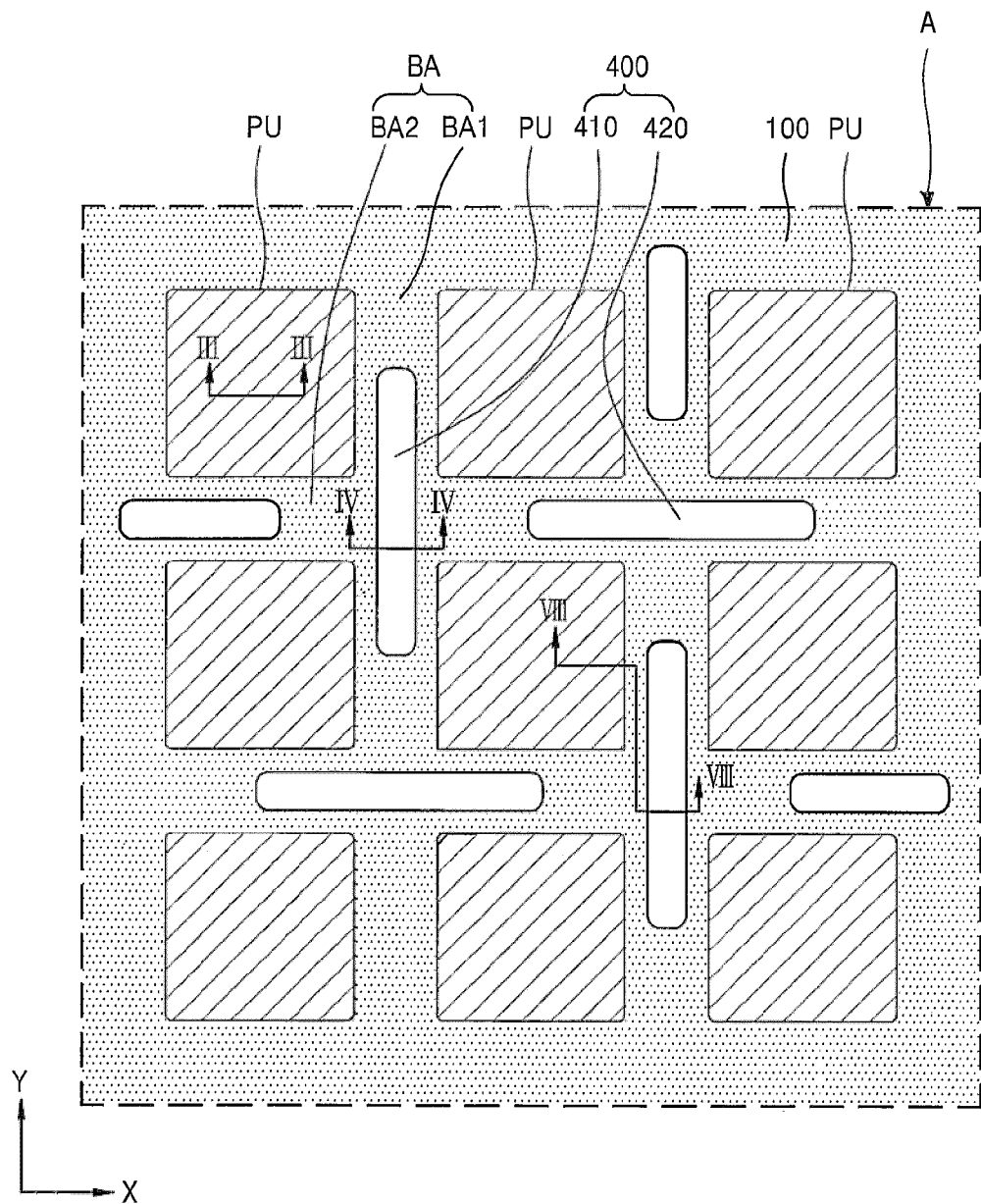
FIG. 2 is a plan view schematically illustrating an enlarged portion A of FIG. 1.

FIG. 1 is a plan view schematically illustrating a display device 1 according to an exemplary embodiment. FIG. 2 is a plan view schematically illustrating an enlarged portion A of FIG. 1.

Referring to FIGS. 1 and 2, the display device 1 includes a substrate 100. A display area DA and a non-display area NDA are defined on the substrate 100. One or more pixel units PU and through parts or through holes 400 are formed in the display area DA.

The substrate 100 can be formed of various materials. The substrate 100 can be formed of glass, metal, an organic material, or other materials. For example, the substrate 100 is formed of a flexible material. That is, the substrate 100 can be formed of a material which is bent, curved, and folded or rolled. The flexible material forming the substrate 100 can be thin glass, metal, or plastic. When the substrate 100 includes plastic, the flexible substrate 100 can be formed of a plastic material such as polyethylene terephthalate (PET), polyethylene naphthalate (PEN), or polyimide which has good heat resistance and durability and enables a curve to be implemented.

The substrate 100 can be divided into the display area DA and the non-display area NDA. The display area DA is an area in which a plurality of pixel units or plurality of pixels PU are arranged, and can display an image. The display area DA can include a pixel area, in which the pixel units PU are arranged, and a separation area between adjacent pixel areas. Each of the pixel units PU can include a display device (not shown) so as to implement visible light.

The non-display area NDA can be formed to be adjacent to the display area DA. In FIG. 1, the non-display area NDA is illustrated to surround the display area DA. In some embodiments, the non-display area NDA is formed to be adjacent to one side of the display area DA. In some other embodiments, the non-display area NDA is formed to be adjacent to two sides or three sides of the display area DA. Also, depending on the case, only the display area DA can be formed on the substrate 100. That is, although not shown, in some embodiments, the non-display area NDA is not formed on the substrate 100, and only the display area DA is formed on the substrate 100.

The one or more pixel units PU and through parts 400 can be formed in the display area DA. In this case, a separation area BA can be formed between one pixel unit PU and another pixel unit PU adjacent thereto. The through parts 400 can be formed in the separation area BA. Depending on the case, the through part 400 can be formed to be separated from the pixel unit PU.

Each of the pixel units PU includes the display device, which can be an organic light-emitting diode (OLED) or a liquid crystal device. This will be described below in detail.

The through parts 400 are formed on the substrate 100. That is, each of the through parts 400 is formed to include an inner surface which passes through the substrate 100. For example, the through parts 400 are formed by removing one region of the substrate 100 through a process such as etching. As another example, the substrate 100 is formed to include the through parts 400 in manufacturing the substrate 100. The process of forming the through parts 400 on the substrate 100 can vary, and a method of manufacturing the through parts 400 is not limited. Each of the through parts 400 can have a shape which extends in the separation area BA from one pixel unit PU to another pixel unit PU adjacent thereto.

Each of the through parts 400 includes a first through part 410 and a second through part 420. The separation area BA includes a first separation area BA1 and a second separation area BA2. The first through part 410 is formed in the first separation area BA1, and the second through part 420 is formed in the second separation area BA2. Hereinafter, the through parts 400 will be described in detail.

The separation area BA includes the first separation area BA1 and the second separation area BA2. It can be understood that the first separation area BA1 is an area between two pixel units PU which are adjacent to each other in a first direction, for example, an X axis direction of FIG. 2. It can be understood that the second separation area BA2 is an area between two pixel units PU which are adjacent to each other in a second direction, for example, a Y axis direction of FIG. 2. Depending on the case, the first direction can be substantially perpendicular to or crossing the second direction.

The first through part 410 of each of the through parts 400 can be formed in the first separation area BA1. The first through part 410 can have a shape which extends along a direction (for example, the second direction (the Y axis direction)) intersecting the first direction (the X axis direction).

In some embodiments, the first through part 410 is formed to pass through the first separation area BA1, and for example, formed to correspond to an area in which an area extending from the first separation area BA1 overlaps an area extending from the second separation area BA2.

Moreover, the first through part 410 can extend in the second direction to the first separation area BA1 between two adjacent pixel units PU, which are adjacent to each of two pixel units PU, which are adjacent to each other in the first direction, in the second direction, in addition to the first separation area BA1 between the two pixel units PU which are adjacent to each other in the first direction.

Therefore, the first through part 410 can correspond to one side of each of the two pixel units PU which are adjacent to each other in the first direction, and correspond to one side of each of the two pixel units PU which are adjacent to each of the two pixel units PU in the second direction. For example, four pixel units PU are formed around one first through part 410.

For example, as illustrated in FIG. 2, two pixel units PU are respectively formed at a left side and a right side with the first through part 410 therebetween to correspond to each other, on the first through part 410. Two pixel units PU can be respectively formed at a left side and a right side with the first through part 410 therebetween to correspond to each other, under the first through part 410.

The second through part 420 of each of the through parts 400 can be formed in the second separation area BA2. The second through part 420 can extend along a direction (for example, the first direction) intersecting the second direction.

In some embodiments, the second through part 420 is formed to pass through the second separation area BA2, and for example, is formed to correspond to an area in which an area extending from the second separation area BA2 overlaps an area extending from the first separation area BA1.

Moreover, the second through part 420 can extend in the first direction to the second separation area BA2 between two adjacent pixel units PU, which are adjacent to each of two pixel units PU, which are adjacent to each other in the second direction, in the first direction, in addition to the second separation area BA2 between the two pixel units PU which are adjacent to each other in the second direction.

Therefore, the second through part 420 may correspond to one side of each of the two pixel units PU which are adjacent to each other in the second direction, and correspond to one side of each of the two pixel units PU which are adjacent to each of the two pixel units PU, which are adjacent to each other in the second direction, in the first direction. For example, four pixel units PU are formed with respect to one second through part 420.

As illustrated in FIG. 2, two pixel units PU are respectively formed at an upper side and a lower side with respect to the second through part 420, on a left side of the second through part 420. Two pixel units PU can be respectively formed at an upper side and a lower side with respect to the second through part 420, on a right side of the second through part 420.

The first through part 410 and the second through part 420 can be separated from each other. Referring to FIG. 2, in the display device 1, the through parts 400 are formed on the substrate 100, and each of the through parts 400 includes a plurality of the first through parts 410 and a plurality of second through parts 420.

Moreover, the second through part 420 can be formed between two adjacent first through parts 410 among the first through parts 410. The first through part 410 can be formed between two adjacent second through parts 420.

Figure 3:
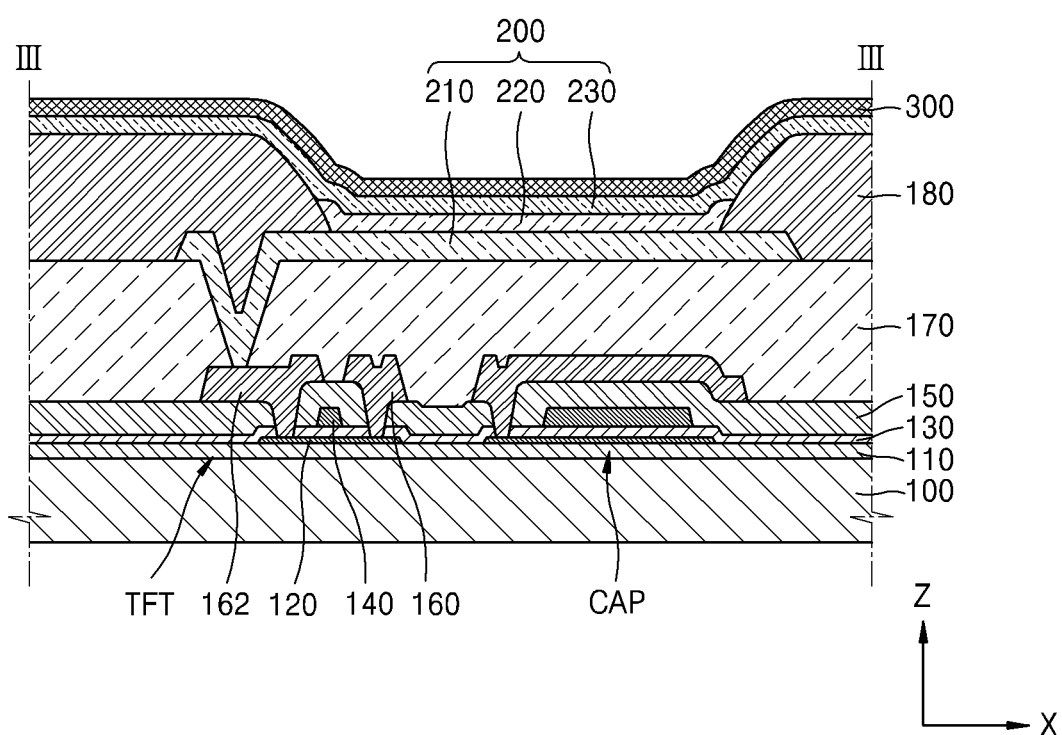
FIG. 3 is a cross-sectional view taken along line III-III of FIG. 2.

FIG. 3 is a cross-sectional view taken along line III-III of FIG. 2. In FIG. 3, the display area DA of the display device 1 will be described in detail. As described above, a plurality of display devices formed in the display area DA can be OLEDs or liquid crystal devices. In the present embodiment, a display device including OLEDs will be described.

Referring to FIG. 3, a thin film transistor TFT and a capacitor CAP are formed on the substrate 100, and an OLED electrically connected to the thin film transistor TFT is formed on the substrate 100. The thin film transistor TFT includes a semiconductor layer 120, a gate electrode 140, a source electrode 160, and a drain electrode 162 and can be formed of amorphous silicon, polycrystalline silicon, or an organic semiconductor material. Hereinafter, a general configuration of the thin film transistor TFT will be described in detail.

A buffer layer 110 which is formed of silicon oxide or silicon nitride can be formed on the substrate 100 so as to planarize a surface of the substrate 100 or prevent impurities from penetrating into the semiconductor layer 120 of the thin film transistor TFT, and the semiconductor layer 120 can be formed on the buffer layer 100.

The gate electrode 140 is formed on the semiconductor layer 120. In this case, the source electrode 160 and the drain electrode 162 are electrically connected to each other according to a signal applied to the gate electrode 140. The gate electrode 140 can be formed of a single layer or a multilayer formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) in consideration of adhesiveness to an adjacent layer, a surface flatness of a stacked layer, and processability.

In this case, a gate insulating layer 130 which is formed of silicon oxide and/or silicon nitride can be formed between the semiconductor layer 120 and the gate electrode 140, for securing dielectric properties between the semiconductor layer 120 and the gate electrode 140.

An interlayer insulating layer 150 can be formed on the gate electrode 140, and can be formed of a single layer or a multilayer with silicon oxide or silicon nitride.

The source electrode 160 and the drain electrode 162 are formed on the interlayer insulating layer 150. The source electrode 160 and the drain electrode 162 are electrically connected to the semiconductor layer 120 through respective contact holes which are formed in the interlayer insulating layer 150 and the gate insulating layer 130. The source electrode 160 and the drain electrode 162 can be formed of a single layer or a multilayer formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) in consideration of conductivity.

Although not shown, a protective layer (not shown) which covers the thin film transistor TFT can be formed for protecting the thin film transistor TFT having the structure. The protective layer can be formed of, for example, an organic material such as silicon oxide, silicon nitride, or silicon oxynitride.

Figure 10:
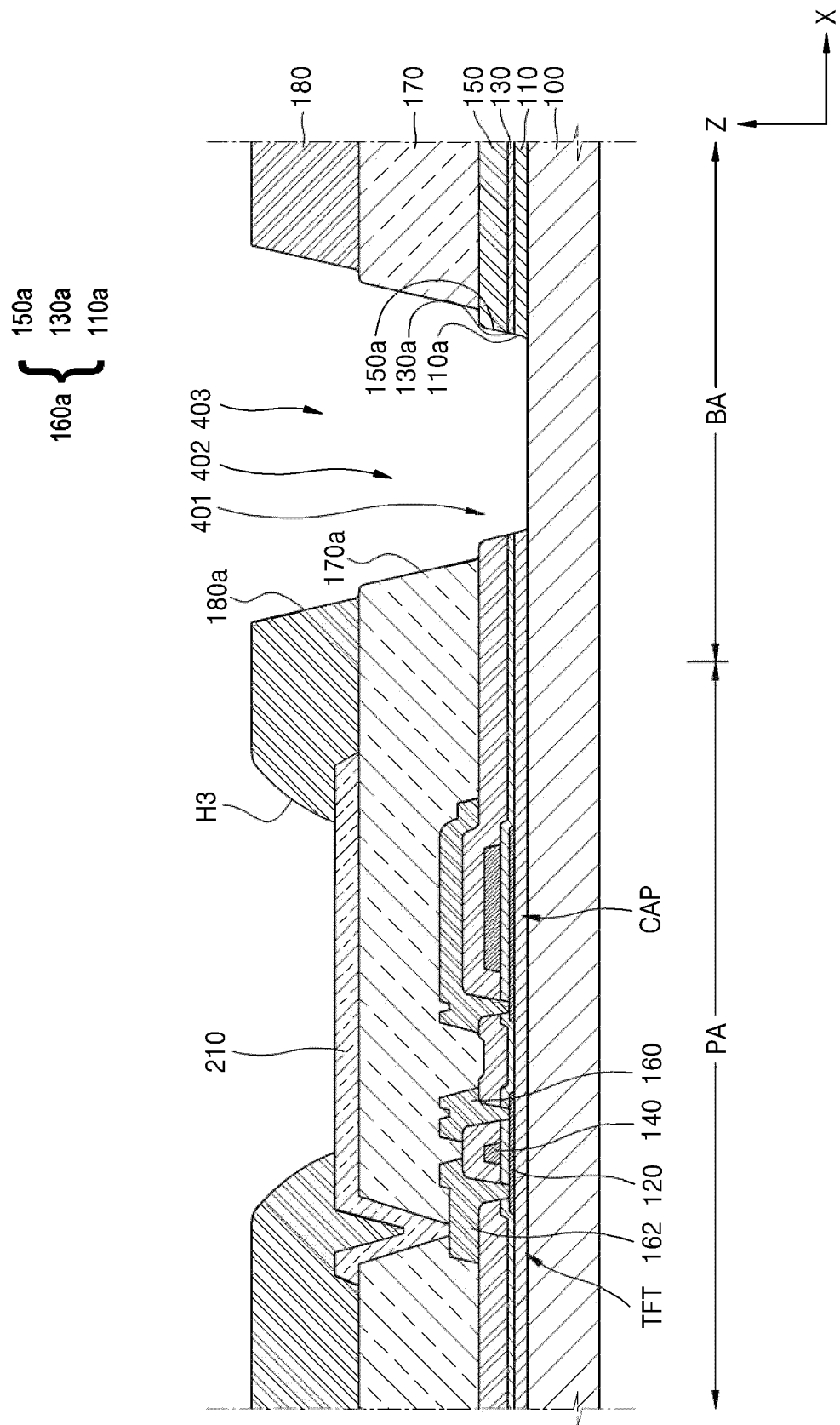

A first insulating layer 170 can be formed on the substrate 100. In this case, the first insulating layer 170 can be a planarizing a layer of a protective layer. When an OLED is formed on the thin film transistor TFT, the first insulating layer 170 planarizes a top of the thin film transistor TFT and protects the thin film transistor TFT and various devices. The first insulating layer 170 can be formed of, for example, an acryl-based organic material or benzocyclobutene (BCB). In this case, as illustrated in FIG. 10, the buffer layer 110, the gate insulating layer 130, the interlayer insulating layer 150, and the first insulating layer 170 can be formed over the substrate 100.

A second insulating layer 180 can be formed on the thin film transistor TFT. In this case, the second insulating layer 180 can be a pixel unit defining layer. The second insulating layer 180 can be formed on the first insulating layer 170 and can have an opening. The second insulating layer 180 defines a pixel area on the substrate 100.

The second insulating layer 180 can be formed of, for example, an organic insulating layer. The organic insulating layer can be formed of an acryl-based polymer such as poly(methyl methacrylate) (PMMA), polystyrene (PS), polymer derivatives containing a phenol group, an imide-based polymer, an arylether-based polymer, an amide-based polymer, a fluorine-based polymer, a p-xylene-based polymer, a vinyl alcohol-based polymer, or a compound thereof.

An OLED 200 can be formed on the second insulating layer 180. The OLED 200 can include a pixel unit electrode 210, an intermediate layer 220 including an emission layer (EML), and an opposite electrode 230.

The pixel unit electrode 210 can be formed as a (semi) transparent electrode or a reflective electrode. When the pixel unit electrode 210 is formed as the (semi)transparent electrode, the pixel unit electrode 210 can be formed of, for example, indium-tin-oxide (ITO), indium-zinc-oxide (IZO), zinc oxide (ZnO), indium oxide ($In_2O_3$), indium gallium oxide (IGO), or aluminum zinc oxide (AZO). When the pixel unit electrode 210 is formed as the reflective electrode, the pixel unit electrode 210 can further include a reflective layer, which is formed of Ag, Mg, Al, Pt, Pd, Au, Ni, Nd, Ir, Cr, or a compound thereof, and a layer which is formed of ITO, IZO, ZnO, $In_2O_3$, IGO, or AZO. However, the present embodiment is not limited thereto. For example, the pixel unit electrode 210 can be formed of various materials, and a structure of the pixel unit electrode 210 can be variously modified to include a single layer or a multilayer.

The intermediate layer 220 can be formed in the pixel area defined by the second insulating layer 180. The intermediate layer 220 includes the EML that emits light according to an electrical signal, and can include a hole injection layer (HIL) and a hole transport layer (HTL), which are formed between the EML and the pixel unit electrode 210, and an electron transport layer (ETL) and an electron injection layer (EIL) which are formed between the EML and the opposite electrode 230, in addition to the EML. The HIL, the HTL, the ETL, and the EIL can be stacked in a single structure or a complex structure. The intermediate layer 220 is not limited thereto, and can have various structures.

The opposite electrode 230, which covers the intermediate layer 220 including the EML and is opposite to the pixel unit electrode 210, can be formed over the substrate 100. The opposite electrode 230 can be formed as a transparent (or semi-transparent) electrode or a reflective electrode.

When the opposite electrode 230 is formed as the (semi) transparent electrode, the opposite electrode 230 can include a layer, which is formed of metal (i.e., Li, Ca, LiF/Ca, LiF/Al, Al, Ag, Mg, or a compound thereof) having a small work function, and a (semi)transparent conductive layer formed of ITO, IZO, ZnO, or $In_2O_3$. When the opposite electrode 230 is formed as the reflective electrode, the opposite electrode 230 can include a layer which is formed of Li, Ca, LiF/Ca, LiF/Al, Al, Ag, Mg, or a compound thereof. A configuration and a material of the opposite electrode 230 are not limited thereto, and can be variously modified.

Referring to FIG. 3, an encapsulation layer 300 is formed on the substrate 100 to cover the OLED 200. Although not shown in FIG. 3, the encapsulation layer 300 can have a multi-layer structure in which one or more inorganic layers (not shown) and organic layers (not shown) are stacked. The reason that the encapsulation layer 300 is formed in a multi-layer structure is because when the encapsulation layer 300 is formed as only an organic layer or an inorganic layer, oxygen or moisture penetrates into the inside through a fine path which is formed in a layer, and damages a display unit. Pixel units are shut off from the outside and sealed by the encapsulation layer 300.

An organic material included in the organic layer includes, for example, acryl-based resin, methacryl-based resin, vinyl-based resin, epoxy-based resin, urethane-based resin, cellulose-based resin, and/or perylene-based resin.

An inorganic material included in the inorganic layer includes, for example, silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

Figure 4A:
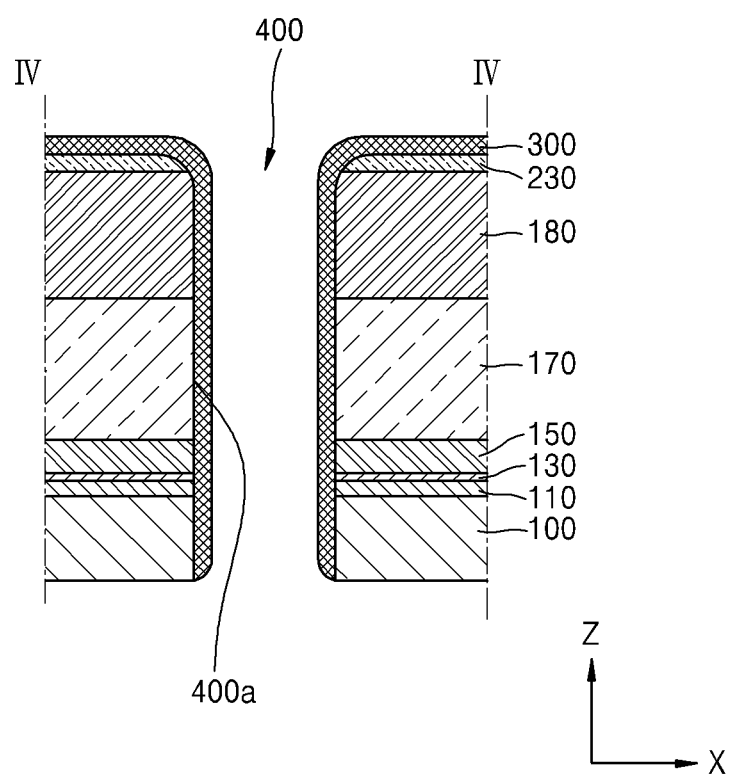
FIGS. 4A to 4C are cross-sectional views taken along line VI-VI of FIG. 2.
Figure 4B:
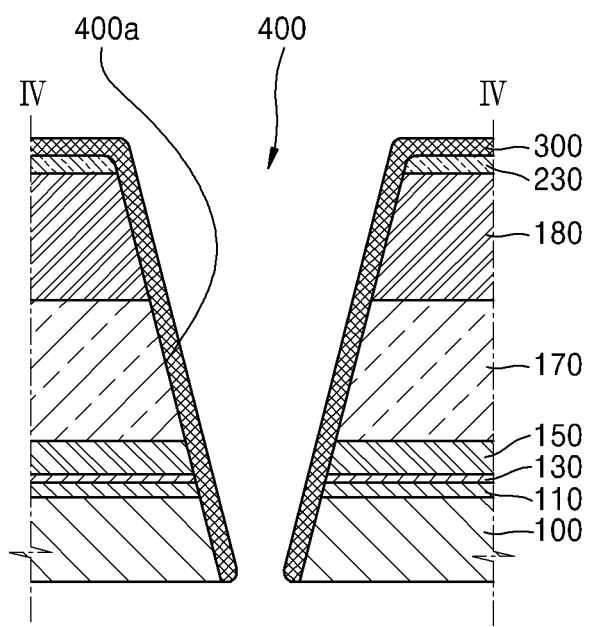
Figure 4C:
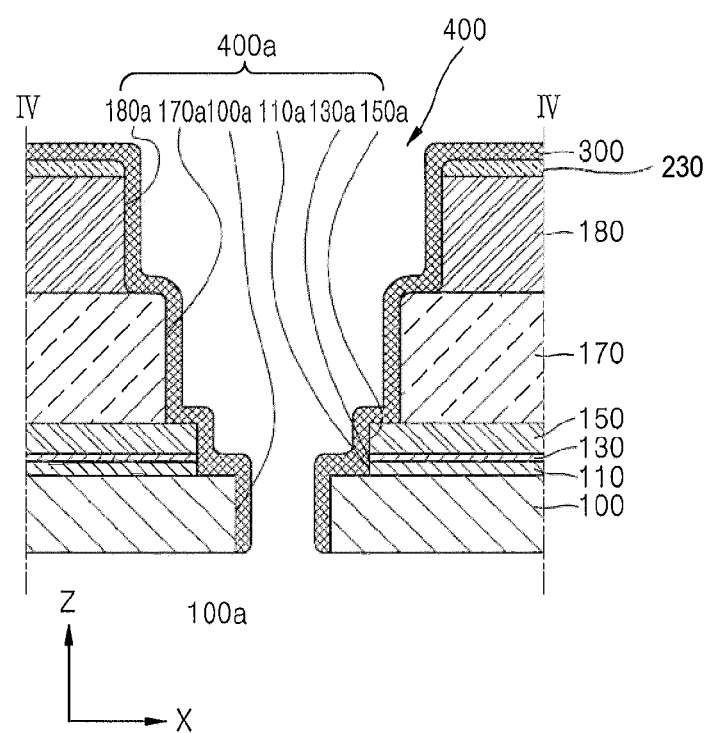

FIGS. 4A to 4C are cross-sectional views taken along line VI-VI of FIG. 2. In FIGS. 4A to 4C, exemplary embodiments of a structure of the through part 400 will be described in detail.

Referring to FIGS. 4A to 4C, the through part 400 is formed in the separation area BA. In FIGS. 4A to 4C, a cross-sectional surface of the first through part 410 formed in the first separation area BA1 is illustrated, but the second through part 420 formed in the second separation area BA2 can also have the same structure as that of the first through part 410.

Referring to FIG. 4A, the through part 400 is formed to pass through the substrate 100 and includes an inner surface 400a which passes through the substrate 100. The inner surface 400a denotes a cross-sectional surface that is formed to pass through the substrate 100 and one or more material layers formed on the substrate 100. In some embodiments, the inner surface 400a of the through part 400 is formed to be approximately vertical to the substrate 100 or substantially perpendicular to a surface of the substrate 100.

The encapsulation layer 300 in which an organic layer and an inorganic layer are alternately formed can be formed on the OLED and can be formed to cover the inner surface 400a of the through part 400. When the encapsulation layer 300 is not formed to cover the inner surface 400a, moisture or impurities can flow into one or more material layers in which a cross-sectional surface is exposed due to the inner surface 400a and damage various devices or OLEDs. Therefore, when the encapsulation layer 300 is sealed to cover the inner surface 400a, a reliability of the display device is enhanced.

Referring to FIG. 4B, the inner surface 400a is formed to have a slope. That is, the inner surface 400a can be an inclined surface. The inner surface 400a can have a shape in which a width is narrowed in a direction from the opposite electrode 230 to the substrate 100. That is, the inner surface 400a can have a V-shape with the substrate 100 side opened. A slope of the inner surface 400a can be formed to make an acute angle with respect to the substrate 100.

The inner surface 400a having a slope denotes that a cross-sectional surface, which is formed to pass through one or more material layers formed on the substrate 100, has a slope. In order to form such an artificial inclined surface, a process of patterning a material layer can use a halftone mask or a slit mask. However, a method of forming a through hole having an inclined surface in the inner surface 400a is not limited. Therefore, in forming the encapsulation layer 300, it is very easy for the encapsulation layer 300 to cover the inner surface 400a of the through hole.

Referring to FIG. 4C, the through part 400 is formed to pass through the substrate 100 and includes an inner surface 400a which passes through the substrate 100. The inner surface 400a denotes a cross-sectional surface that is formed to pass through the substrate 100 and one or more material layers 190 formed on the substrate 100. The one or more material layers 190 include, for example, the buffer layer 110, the gate insulating layer 130, the interlayer insulating layer 150, the first insulating layer 170, and the second insulating layer 180. Therefore, the material layers 190 can include a plurality of end surfaces 110a, 130a, 150a, 170a and 180a corresponding to the inner surface 400a of the through part 400.

In some embodiments, the inner surface 400a is formed in a stair shape. This denotes that each of the end surfaces 110a, 130a, 150a, 170a and 180a of the material layers 190 is formed to have a step height. The inner surface 400a can be formed in order for a width to be narrowed in a direction from the opposite electrode 230 to the substrate 100. That is, in FIG. 4C, the end surfaces 110a, 130a and 150a can be formed to protrude toward the through part 400, and the end surfaces 170a and 180a can be stacked thereon to have a step height. An end surface 100a of the substrate 100 can be formed to have the same plane as those of the end surfaces 110a, 130a and 150a, or can be formed to protrude further than the end surfaces 110a, 130a and 150a.

In FIG. 4C, the end surfaces 110a of the buffer layer 110, the end surface 130a of the gate insulating layer 130, and the end surface 150a of the interlayer insulating layer 150 are formed on substantially the same plane. This is because the buffer layer 110, the gate insulating layer 130, and the interlayer insulating layer 150 are substantially simultaneously or concurrently patterned in a process of forming a contact hole which enables the semiconductor layer 120, the source electrode 160, and the drain electrode 162 to be electrically connected to each other. However, the present embodiment is not limited thereto. Depending on the case, each of the end surfaces 110a, 130a and 150a can be formed to have a step height.

The encapsulation layer 300 can be formed all over the substrate 100 to seal the OLED and cover the end surfaces 110a, 130a, 150a, 170a and 180a. Due to an inner structure of the through hole, in forming the encapsulation layer 300, it is very easy for the encapsulation layer 300 to cover the inner surface 400a of the through hole. Therefore, the encapsulation layer 300 is sealed to cover the inner surface 400a, thereby enhancing a reliability of the display device.

Figure 5:
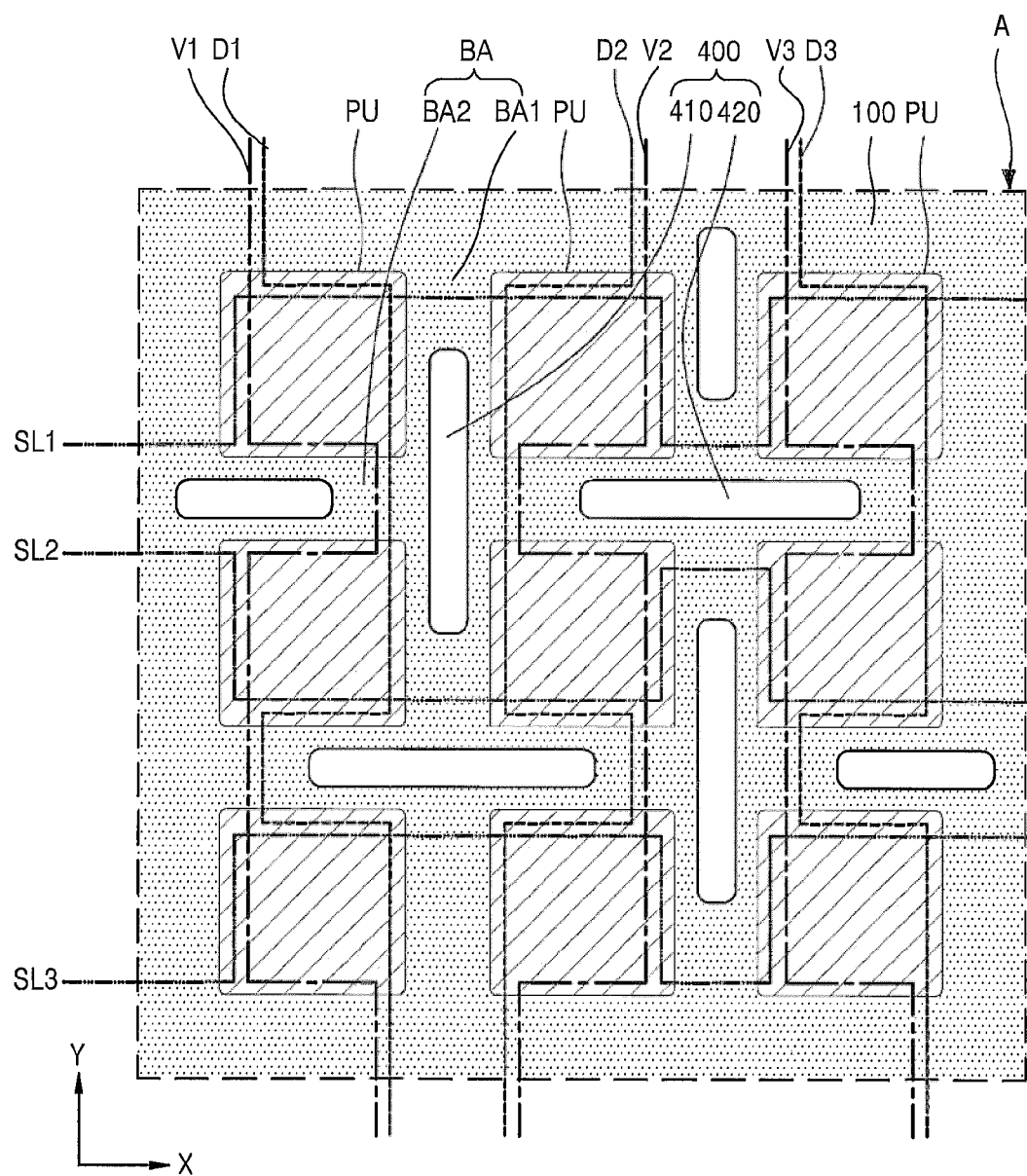
FIG. 5 is a plan view schematically illustrating the enlarged portion A of FIG. 1.

FIG. 5 is a plan view schematically illustrating the enlarged portion A of FIG. 1.

Referring to FIG. 5, the display device 1 includes the substrate 100 and one or more wirings SL1 to SL3, V1 to V3, and D1 to D3.

The display area DA and the non-display area NDA are defined on the substrate 100. The one or more pixel units PU and through parts 400 are formed in the display area DA.

The substrate 100 is divided into the display area DA and the non-display area NDA. Details of positions of the display area DA and the non-display area NDA are the same as those of the above-described exemplary embodiment, and thus, their detailed descriptions are not provided.

The pixel units PU and through parts 400 are formed in the display area DA. Each of the pixel units PU can include a display element (not shown) so as to emit visible light. This is the same as the above-described exemplary embodiment, and the structure described above with reference to FIG. 3 can be applied.

The through parts 400 are formed on the substrate 100. The through parts 400 and the separation area BA are as described in the above-described exemplary embodiment, and thus, their detailed descriptions are not provided.

The one or more wirings SL1 to SL3, V1 to V3, and D1 to D3 are wirings which are electrically connected to the pixel units PU, and are formed to be separated from the through parts 400 without overlapping the through parts 400.

The one or more wirings SL1 to SL3, V1 to V3, and D1 to D3 can include one or more first wirings SL1 to SL3.

The first wirings SL1 to SL3 are electrically connected to the pixel units PU. In some embodiments, the first wiring SL1 is electrically connected to a plurality of pixel units PU which are arranged in one row in a first direction (an X axis direction of FIG. 5). The first wiring SL1 is formed to have a curve. That is, the first wiring SL1 can include a region, which extends in the first direction, and a region which is bent in a second direction (a Y axis direction of FIG. 5), along a periphery of the first through part 410. The region which is bent can denote a region which protrudes in the second direction. Therefore, the first wiring SL1 is separated from the first through part 410 and the second through part 420.

In some embodiments, the first wiring SL1 is electrically connected to a plurality of pixel units PU which are formed under the first wiring SL1, namely, formed to be adjacent to each other in the second direction intersecting the first direction, and are arranged in one row in the first direction.

The first wiring SL2 is formed to have a curve. That is, the first wiring SL2 can include a region, which extends in the first direction, and a region which is bent in the second direction along the periphery of the first through part 410. The region which is bent in the second direction can denote a region which protrudes in the second direction. Therefore, the first wiring SL2 is separated from the first through part 410 and the second through part 420.

In some embodiments, the first wiring SL2 is substantially symmetrical with the first wiring SL1. In some embodiments, the first wiring SL2 and the first wiring SL1 are substantially symmetrical about the second through part 420.

The first wiring SL3 has the same form as that of the first wiring SL1. The first wiring SL3 can be electrically connected to a plurality of pixel units PU which are arranged in one row in the first direction (the X axis direction of FIG. 5). The first wiring SL3 is formed to have a curve. That is, the first wiring SL3 can include a region, which extends in the first direction, and a region which is bent in the second direction along the periphery of the first through part 410. The region which is bent in the second direction can denote a region which protrudes in the second direction. Therefore, the first wiring SL3 is separated from the first through part 410 and the second through part 420.

Although not shown, a first wiring (not shown) having the same form as that of the first wiring SL2 can be formed under the first wiring SL3. Also, an arrangement of the first wirings SL1 to SL3 can be repeated.

The first wirings SL1 to SL3 can transfer various signals to the pixel units PU. In some embodiments, the first wirings SL1 to SL3 transfer a scan signal to the pixel units PU. As another example, the first wirings SL1 to SL3 are electrically connected to a gate electrode 105 of a thin film transistor illustrated in FIG. 7.

The wirings SL1 to SL3, V1 to V3, and D1 to D3 can include one or more second wirings V1 to V3. The second wirings V1 to V3 are electrically connected to the pixel units PU. In some embodiments, the second wiring V1 is electrically connected to a plurality of pixel units PU which are arranged in one row in the second direction (the Y axis direction of FIG. 5).

The second wiring V1 is formed to have a curve. That is, the second wiring V1 can include a region, which extends in the second direction, and a region which is bent in the first direction (the X axis direction of FIG. 5) along a periphery of the second through part 420. The region which is bent in the first direction can denote a region which protrudes in the first direction. Therefore, the second wiring V1 is separated from the first through part 410 and the second through part 420.

In some embodiments, the second wiring V1 can be electrically connected to a plurality of pixel units PU which are formed to be adjacent to each other a side direction of the second wiring V1 (for example, a right side), namely, in the first direction (the X axis direction of FIG. 5) intersecting the second direction, and are arranged in one row in the second direction.

The second wiring V2 is formed to have a curve. That is, the second wiring V2 can include a region, which extends in the first direction, and a region which is bent in the second direction along the periphery of the first through part 410. The region which is bent in the second direction (the Y axis direction of FIG. 5) can denote a region which protrudes in the second direction. Therefore, the first wiring SL2 is separated from the first through part 410 and the second through part 420.

In some embodiments, the second wiring V2 can be symmetrical with the second wiring V1, and in detail, the second wiring V2 and the second wiring V1 can be symmetrical about the first through part 410.

The second wiring V3 has the same form as that of the second wiring V1. The second wiring V3 can be electrically connected to a plurality of pixel units PU which are arranged in one row in the second direction. The second wiring V3 is formed to have a curve. That is, the second wiring V3 can include a region, which extends in the second direction, and a region which is bent in the first direction along the periphery of the second through part 420. The region which is bent in the first direction can denote a region which protrudes in the first direction. Therefore, the first wiring SL3 is separated from the first through part 410 and the second through part 420.

Although not shown, a second wiring (not shown) having the same form as that of the second wiring V2 can be formed on the right of the second wiring V3. Also, an arrangement of the second wirings V1 to V3 can be repeated.

The second wirings V1 to V3 can transfer various signals to the pixel units PU. In some embodiments, the second wirings V1 to V3 can transfer a signal, which is used to supply power, to the pixel units PU. As another example, the second wirings V1 to V3 can be electrically connected to a first electrode 131 or a second electrode 132 illustrated in FIG. 6 or 7.

The one or more wirings SL1 to SL3, V1 to V3, and D1 to D3 can include one or more third wirings D1 to D3.

The one or more third wirings D1 to D3 are electrically connected to the pixel units PU. In some embodiments, the third wiring D1 can be electrically connected to a plurality of pixel units PU which are arranged in one row in the second direction (the Y axis direction of FIG. 5).

The third wiring D1 is formed to have a curve. That is, the third wiring D1 can include a region, which extends in the second direction, and a region which is bent in the first direction (the X axis direction of FIG. 5) along the periphery of the second through part 420. The region which is bent in the first direction can denote a region which protrudes in the first direction. Therefore, the third wiring D1 is separated from the first through part 410 and the second through part 420.

In some embodiments, the third wiring D1 can be separated from the second wirings V1 to V3. Also, the second through part 420 corresponding to the region of the third wiring D1, that is bent in the first direction, can differ from the second through part 420 corresponding to a region of the second wirings V1 to V3, that is bent in the first direction. For example, the second through parts 420 are adjacent to each other.

In some embodiments, the third wiring D2 can be electrically connected to a plurality of pixel units PU which are formed to be adjacent to each other a side direction of the third wiring D1 (for example, a right side), namely, in the first direction (the X axis direction of FIG. 5) intersecting the second direction, and are arranged in one row in the second direction.

The third wiring D2 is formed to have a curve. That is, the third wiring D2 can include a region, which extends in the second direction, and a region which is bent in the first direction along the periphery of the second through part 420. The region which is bent in the first direction can denote a region which protrudes in the first direction. Therefore, the third wiring D2 is separated from the first through part 410 and the second through part 420.

In some embodiments, the third wiring D2 is substantially symmetrical with the third wiring D1. For example, the third wiring D2 and the third wiring D1 are substantially symmetrical about the first through part 410.

In some embodiments, the third wiring D2 is separated from the second wirings V1 to V3. Also, the second through part 420 corresponding to the region of the third wiring D2, which is bent in the first direction, can differ from the second through part 420 corresponding to the region of the second wirings V1 to V3 that is bent in the first direction. For example, the second through parts 420 are adjacent to each other.

The third wiring D3 has substantially the same form as that of the third wiring D1. The third wiring D3 can be electrically connected to a plurality of pixel units PU which are arranged in one row in the second direction. The third wiring D3 is formed to have a curve. That is, the third wiring D3 can include a region, which extends in the second direction, and a region which is bent in the first direction along the periphery of the second through part 420. The region which is bent in the first direction can denote a region which protrudes in the first direction. Therefore, the third wiring D3 is separated from the first through part 410 and the second through part 420.

In some embodiments, the third wiring D3 is separated from the second wirings V1 to V3. Also, the second through part 420 corresponding to a region where the third wiring D3 is bent in a first direction can differ from the second through part 420 corresponding to a region where the second wirings V1 to V3 are bent in the first direction. For example, the second through parts 420 are adjacent to each other.

Although not shown, a third wiring (not shown) having substantially the same form as that of the third wiring D2 can be formed on the right of the third wiring D3. Also, an arrangement of the third wirings D1 to D3 can be repeated.

The third wirings D1 to D3 can transfer various signals to the pixel units PU. In some embodiments, the third wirings D1 to D3 transfer data signals to the pixel units PU. As another example, the third wirings D1 to D3 are electrically connected to a source electrode 107 or a drain electrode 108 illustrated in FIG. 7.

Although not shown, one of FIGS. 3 to 5 can be selectively applied to the display device 1.

In some embodiments, the through part 400 is formed on the substrate 100. Therefore, a flexibility of the substrate 100 is enhanced, and thus, the weight of the substrate 100 is reduced. Also, when the display device 1 is a bending display device, a flexible display device, or a stretchable display device, flexibility is enhanced, and abnormal deformation is reduced.

In some embodiments, since the through part 400 includes the first through part 410 which extends in one direction and the second through part 420 which extends in a direction intersecting the one direction, a flexibility of the substrate 100 is secured even when the substrate 100 is bent, curved, or rolled in various directions, an abnormal deformation of the substrate 100 is prevented, and durability is enhanced. Accordingly, a user's convenience is enhanced when using the display device 1, and the display device 1 is easily applied to, for example, a wearable device.

Moreover, in some embodiments, the first through part 410 can be formed in a long extended form to correspond to two pixel units PU which are adjacent to each other in one direction and two different pixel units PU adjacent to the two pixel units PU. Thus, a change in a deformation characteristic is moderated or reduced on a boundary line between pixel units PU, thereby enhancing a durability of the display device 1. Also, the first through part 410 is easily applied to the display device requiring flexibility, for example, a bending display device, a flexible display device, or a stretchable display device.

Moreover, in some embodiments, the second through part 420 can be formed in a direction intersecting the first through part 410 and can be formed in a long extended form to correspond to two pixel units PU and two different pixel units PU adjacent to the two pixel units PU. Thus, a change in a deformation characteristic is moderated or reduced on a boundary line between pixel units PU, thereby enhancing a durability of the display device 1. Also, the second through part 420 is easily applied to the display device requiring flexibility, for example, a bending display device, a flexible display device, or a stretchable display device.

Moreover, the display device 1 can include the one or more wirings SL1 to SL3, V1 to V3, and D1 to D3 which are electrically connected to the pixel units PU. In some embodiments, the one or more wirings SL1 to SL3, V1 to V3, and D1 to D3 are formed to be separated from the through part 400 without overlapping the through part 400. Therefore, a flexibility and a durability of the substrate 100 are enhanced due to the through part 400. Also, the wirings SL1 to SL3, V1 to V3, and D1 to D3 can be prevented from being stripped because of not overlapping the through part 400, prevented from being polluted by a gas such as external oxygen, and prevented from being degenerated by moisture.

Kind-based or the same kinds of wirings, namely, the wirings SL1 to SL3, can extend in one direction and have a curved shape, and can be repeated at certain periods, and thus, a non-uniformity of each pixel unit PU caused by the wirings SL1 to SL3 is reduced or prevented.

Moreover, the wirings V1 to V3 can extend in one direction and have a curved shape, and can be repeated at certain periods, and thus, a non-uniformity of each pixel unit PU caused by the wirings V1 to V3 is reduced or prevented.

Moreover, the wirings D1 to D3 can extend in one direction and have a curved shape, and can be repeated at certain periods, and thus, a non-uniformity of each pixel unit PU caused by the wirings D1 to D3 is reduced or prevented.

Particularly, the wirings V1 to V3 and wirings D1 to D3, which extend in the same direction and are electrically connected to a plurality of pixel units PU which are arranged in the same direction, are formed not to overlap each other, thereby minimizing interference therebetween. Also, curved regions of the wirings V1 to V3 and wirings D1 to D3 correspond to different second through parts 420, and thus, an electrical characteristic of the pixel units PU is prevented from being reduced due to interference in curved portions of the wirings V1 to V3 and wirings D1 to D3.

Figure 6:
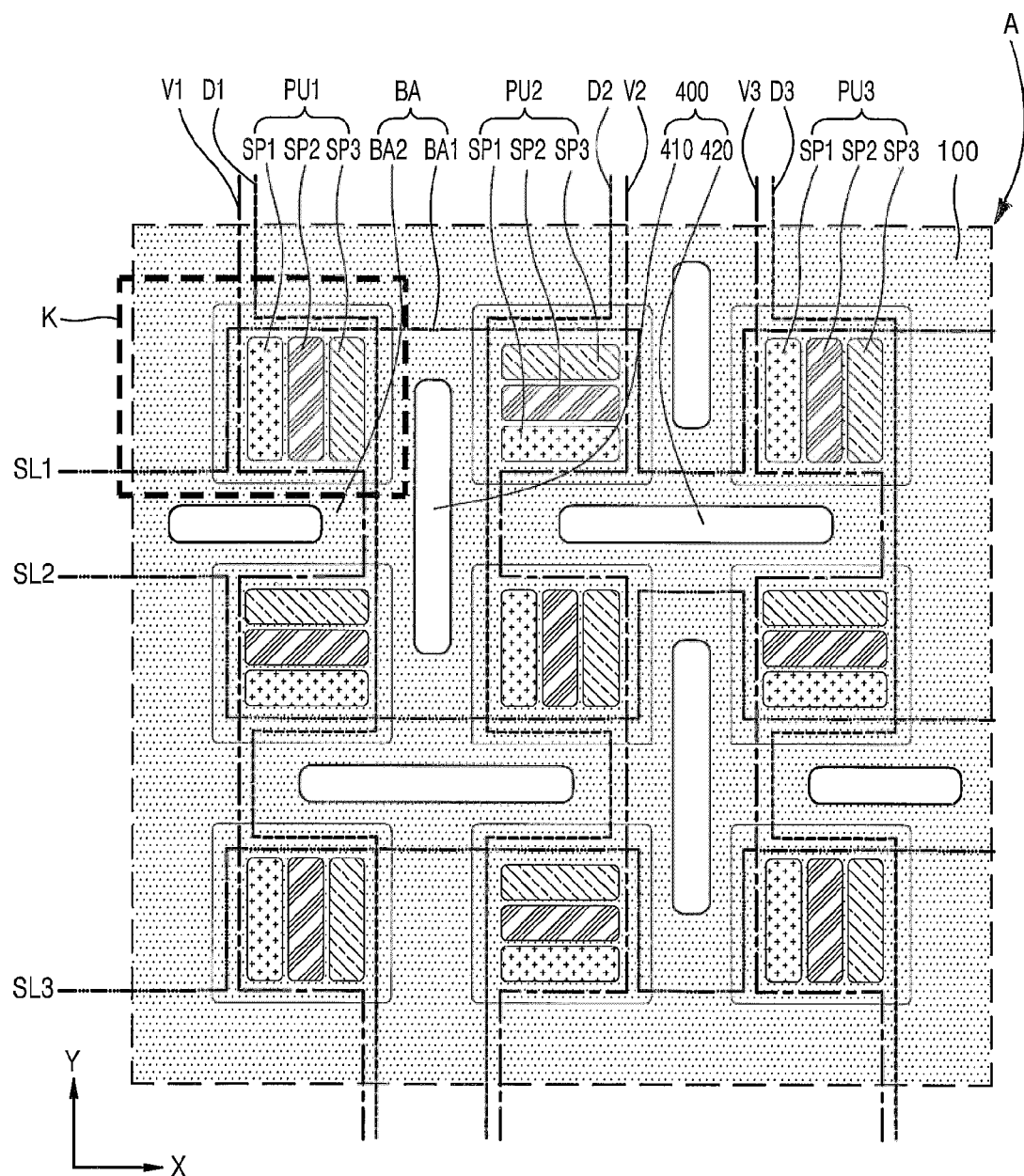
FIG. 6 is a plan view schematically illustrating the enlarged portion A of FIG. 1.
Figure 7:
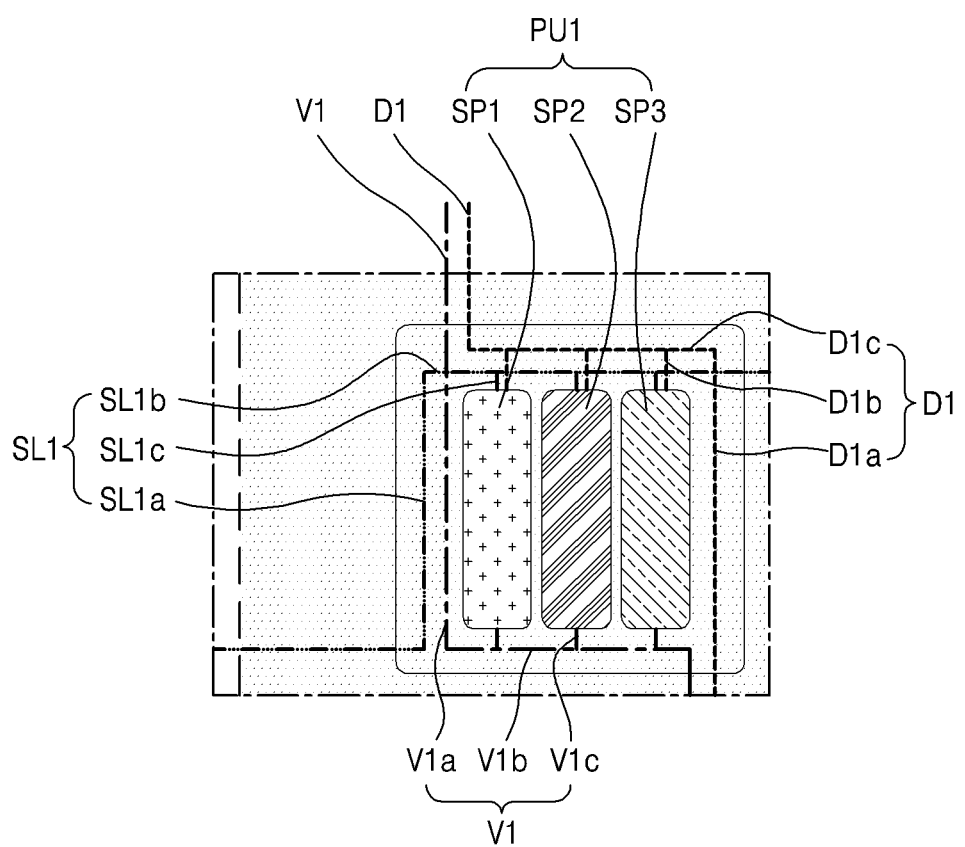
FIG. 7 is a plan view schematically illustrating an enlarged portion K of FIG. 6.

FIG. 6 is a plan view schematically illustrating the enlarged portion A of FIG. 1. FIG. 7 is a plan view schematically illustrating an enlarged portion K of FIG. 6.

Referring to FIGS. 6 and 7, the display device 1 includes the substrate 100 and the wirings SL1 to SL3, V1 to V3, and D1 to D3.

The display area DA and the non-display area NDA are defined on the substrate 100. One or more pixel units PU1 to PU3 and the through parts 400 are formed in the display area DA. Each of the pixel units PU1 to PU3 can include a plurality of sub-pixels SP1 to SP3.

The substrate 100 is divided into the display area DA and the non-display area NDA. The through parts 400 are formed on the substrate 100. The substrate 100 and the through parts 400 are as described above in the above-described exemplary embodiments, and thus, their detailed descriptions are not provided.

Each of the pixel units PU1 to PU3 can include one or more sub-pixels SP1 to SP3.

In FIG. 6, three sub-pixels SP1 to SP3 are illustrated, but the described technology is not limited thereto. One pixel unit PU1 can include two or four or more sub-pixels. In some embodiments, the sub-pixels SP1 to SP3 included in the one pixel unit PU1 emit visible light of different colors.

For example, the sub-pixels SP1 to SP3 respectively implement red visible light, green visible light, and blue visible light.

The sub-pixels SP1 to SP3 included in the one pixel unit PU1 can be sequentially arranged in one direction, for example, in an X axis direction with respect to FIG. 6. Also, another pixel unit PU2 adjacent to the one pixel unit PU1 can includes a plurality of pixel units SP1 to SP3, which can be sequentially arranged in a direction intersecting the one direction, for example, a Y axis direction with respect to FIG. 6.

Moreover, another pixel unit PU3 adjacent to the pixel unit PU2 can include a plurality of pixel units SP1 to SP3, which can be sequentially arranged in a direction intersecting the one direction, for example, in the X axis direction with respect to FIG. 6. In some embodiments, the pixel units SP1 to SP3 included in the pixel units PU1 to PU3 are all be arranged in one direction (the X axis direction), or are arranged in a direction (the Y axis direction) intersecting the one direction.

The wirings SL1 to SL3, V1 to V3, and D1 to D3 can include the first wirings SL1 to SL3, second wirings V1 to V3, and third wirings D1 to D3. The first wirings SL1 to SL3, second wirings V1 to V3, and third wirings D1 to D3 are electrically connected to the pixel units PU1 to PU3. An arrangement of the first wirings SL1 to SL3, the second wirings V1 to V3, and the third wirings D1 to D3 is substantially the same as that of the above-described exemplary embodiment, and thus, its detailed descriptions are not provided.

The following description will be made with reference to FIG. 7. FIG. 7 is a view illustrating the enlarged portion K of FIG. 6.

Referring to FIG. 7, the first wiring SL1 is electrically connected to the sub-pixels SP1 to SP3 of the pixel unit PU1. The first wiring SL1 can have various forms. In some embodiments, the first wiring SL1 includes a plurality of connection lines SL1c which are respectively connected to the sub-pixels SP1 to SP3 and are formed to be separated from each other, a common line SL1b which is connected to the plurality of connection lines SL1c in common, and a body line SP1a which is connected to the common line SL1b and is formed to correspond to a side of one (for example, the sub-pixels SP1) of the sub-pixels SP1 to SP3.

The second wiring V1 is electrically connected to the sub-pixels SP1 to SP3. The second wiring V1 can have various forms. In some embodiments, the second wiring V1 includes a plurality of connection lines V1c which are respectively connected to the sub-pixels SP1 to SP3 and are formed to be separated from each other, a common line V1b which is connected to the connection lines V1c in common, and a body line V1a which is connected to the common line V1b and is formed to correspond to a side of one (for example, the sub-pixels SP1) of the sub-pixels SP1 to SP3.

The third wiring D1 is electrically connected to the sub-pixels SP1 to SP3 of the pixel unit PU1. The third wiring D1 can have various forms. In some embodiments, the third wiring D1 includes a plurality of connection lines D1c which are respectively connected to the sub-pixels SP1 to SP3 and are formed to be separated from each other, a common line D1b which is connected to the plurality of connection lines D1c in common, and a body line D1a which is connected to the common line D1b and is formed to correspond to a side of one (for example, the sub-pixels SP3) of the sub-pixels SP1 to SP3.

In the display device 1, the through part 400 can be formed on the substrate 100. Therefore, a flexibility of the substrate 100 is enhanced, and thus, the weight of the substrate 100 is reduced.

Moreover, the separation area BA between the pixel units PU1 to PU3 is formed on the substrate 100, and thus, when the substrate 100 is deformed, namely, the substrate 100 is bent, curved, or rolled, the substrate 100 is easily deformed near the pixel units PU1 to PU3, and a stress caused by deformation is easily reduced or prevented. That is, when the display device 1 is applied as a bending display device, a flexible display device, or a stretchable display device, flexibility is enhanced, and abnormal deformation is reduced.

In some embodiments, since the through part 400 includes the first through part 410 which extends in one direction and the second through part 420 which extends in a direction intersecting the one direction, a flexibility of the substrate 100 is secured even when the substrate 100 is bent, curved, or rolled in various directions, an abnormal deformation of the substrate 100 is prevented, and durability is enhanced. Accordingly, a user's convenience is enhanced when using the display device 1, and the display device 1 can be easily applied to a wearable device.

Moreover, in some embodiments, the second through part 420 is formed between two adjacent first through parts 410 among the first through parts 410, and thus can prevent a crack from occurring in a length direction of the first through part 410 of the substrate 100 because the first through parts 410 extend in one direction.

Moreover, the first through part 410 can be formed between two adjacent second through parts 420 among the second through parts 420, and thus prevents a crack from occurring in a length direction of the second through part 420 of the substrate 100 because the second through parts 420 extend in one direction.

Moreover, each of the pixel units PU1 to PU3 includes the sub-pixels SP1 to SP3, which are arranged in one direction. A direction, in which the sub-pixels SP1 to SP3 of the pixel unit PU1 are arranged, intersects a direction in which a plurality of sub-pixels SP1 to SP3 adjacent thereto are arranged. Therefore, the sub-pixels SP1 to SP3 can be arranged to correspond to an arrangement direction of the first through part 410 and the second through part 420. Accordingly, even when an arrangement direction of the first through part 410 differs from that of the second through part 420, a non-uniformity of visual influences of the pixel units PU1 to PU3 is minimized, thereby enhancing an image-quality characteristic of the display device 1.

Moreover, the display device 1 can include the wirings SL1 to SL3, V1 to V3, and D1 to D3, and the wirings SL1 to SL3, V1 to V3, and D1 to D3 are formed to be separated from the through part 400 without overlapping the through part 400. Therefore, a flexibility and a durability of the substrate 100 are enhanced due to the through part 400. Also, the wirings SL1 to SL3, V1 to V3, and D1 to D3 are prevented from being stripped because of not overlapping the through part 400, prevented from being polluted by a gas such as external oxygen, and prevented from being degenerated by moisture.

Kind-based or similar wirings, namely, the wirings SL1 to SL3 can extend in one direction and have a curved shape, and can be repeated every certain period, and thus, a non-uniformity of each pixel unit PU caused by the wirings SL1 to SL3 is reduced or prevented. Also, a non-uniformity of the wirings V1 to V3 and the wirings D1 to D3 is reduced or prevented.

For example, the wirings V1 to V3 and the wirings D1 to D3 which extend in the same direction are formed not to overlap each other, thereby minimizing interference therebetween. Also, curved regions of the wirings V1 to V3 and wirings D1 to D3 correspond to different second through parts 420, and thus, an electrical characteristic of the display device 1 is prevented from being reduced due to interference in curved portions of the wirings V1 to V3 and wirings D1 to D3.

Moreover, each of the pixel units PU1 to PU3 includes the sub-pixels SP1 to SP3 which are arranged in a certain direction. The wirings SL1 to SL3, V1 to V3, and D1 to D3 are respectively connected to the sub-pixels SP1 to SP3, and are curved to be separated from the through part 400. To this end, each of the wirings SL1 to SL3, V1 to V3, and D1 to D3 includes a plurality of connections respectively connected to the plurality of sub-pixels SP1 to SP3, a common line, and a body line, and thus, the wirings SL1 to SL3, V1 to V3, and D1 to D3 can be electrically connected to the sub-pixels SP1 to SP3 without overlapping the through part 400.

So far, the display device 1 has been mainly described, but the described technology is not limited thereto. For example, a method of manufacturing a display device is within the scope of the described technology.

FIGS. 8 to 12 are cross-sectional views schematically illustrating a process of manufacturing a display device, according to an exemplary embodiment.

Figure 8:
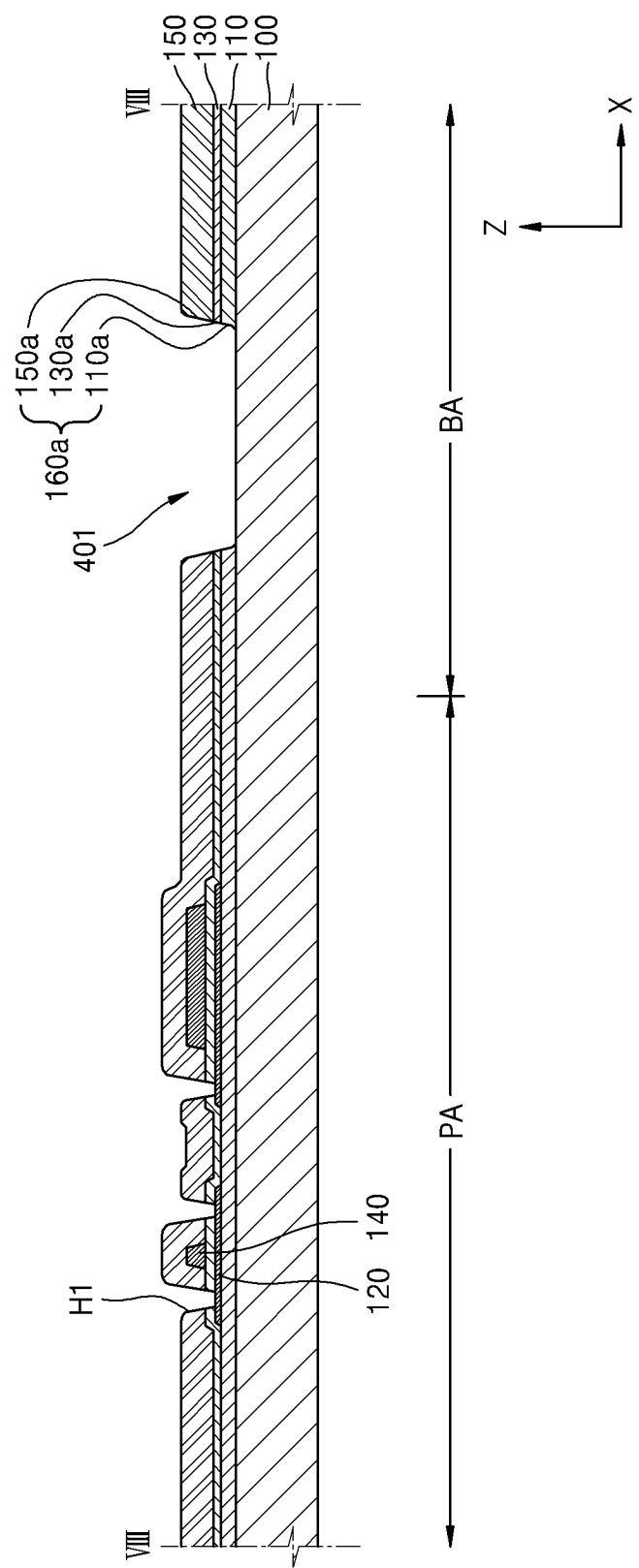
FIGS. 8 to 12 are cross-sectional views schematically illustrating a process of manufacturing a display device, according to an exemplary embodiment.

Referring to FIG. 8, an operation of providing the substrate 100 which includes a pixel area PA in which the pixel units PU are formed and the separation area BA which is formed between two adjacent pixel units PU are performed. The substrate 100 can be formed of various materials. In detail, the substrate 100 can be formed of glass, metal, an organic material, or other materials. In some embodiments, the substrate 100 is formed of a flexible material having flexibility.

An operation of forming the buffer layer 110, the gate insulating layer 130, and the interlayer insulating layer 150 on the substrate 100 can be performed. Also, an operation of forming the semiconductor layer 120 and the gate electrode 140, which configure the thin film transistor TFT, on the substrate 100 can be performed. The interlayer insulating layer 150 can be stacked on the gate electrode 140, and then, a contact hole CNT can be formed in order for the source electrode 160 and the drain electrode 162 to be electrically connected to the semiconductor layer 120.

In an operation of forming a contact hole H1, a first through hole 401 can be substantially simultaneously or concurrently formed in the separation area BA. Therefore, an operation of forming the first through hole 401 in the separation area BA can be performed without adding a separate mask, and thus, the manufacturing cost is reduced.

The end surface 110a of the buffer layer 110, the end surface 130a of the gate insulating layer 130, and the end surface 150a of the interlayer insulating layer 150 can be exposed through the first through hole 401. The end surfaces 110a, 130a and 150a can be first end surfaces 160a of the first through hole 401. The first end surfaces 160a can be formed to have the same plane. This is because the first through hole 401 is formed in an operation of forming the contact hole H1. In some embodiments, the first end surfaces 160a are formed in a stepped form to have different planes.

Figure 9:
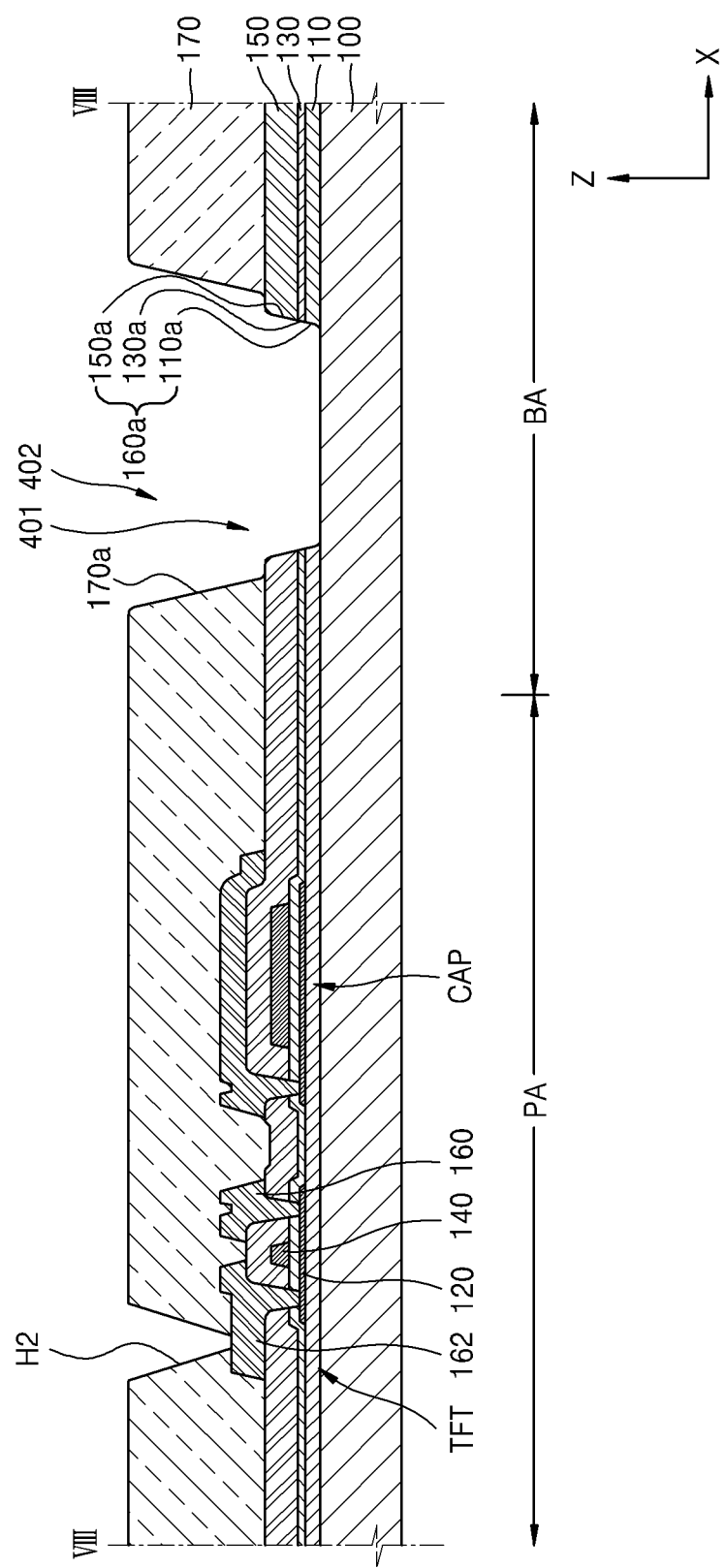

Referring to FIG. 9, the source electrode 160 and the drain electrode 162 which are electrically connected to the semiconductor layer 120 through the contact hole H1 are formed on the gate electrode 140. The first insulating layer 170 can be stacked on the source electrode 160 and the drain electrode 162. An operation of forming a via hole H2 in the first insulating layer 170 can be performed in order for the pixel electrode 210 to be electrically connected to one selected from the source electrode 160 and the drain electrode 162.

In the operation of forming the via hole H2, the second through part 420 can be substantially simultaneously or concurrently formed in the separation area BA. Therefore, an operation of forming the second through part 420 in the separation area BA can be performed without adding a separate mask, and thus, the manufacturing cost is reduced.

The second end surface 170a can be exposed through the second through part 420. This is because the second through part 420 is formed in the operation of forming the via hole H2. In this case, the width of the second through part 420 can be formed greater than that of the first through hole 401.

Referring to FIG. 10, an operation of patterning and forming the pixel electrode 210 on the first insulating layer 170 is performed for each pixel. The pixel electrode 210 can be electrically connected to one of the source electrode 160 and drain electrode 162 of the thin film transistor TFT through the via hole H2 which is formed in the first insulating layer 170.

After the pixel electrode 210 is formed, an operation of forming the second insulating layer 180 to expose a center portion of the pixel electrode 210 and cover an edge of the pixel electrode 210 can be performed. The second insulating layer 180 can be understood as a pixel defining layer.

In an operation of forming an opening H3 where the second insulating layer 180 exposes the center portion of the pixel electrode 210, a third through hole 403 can be substantially simultaneously or concurrently formed in the separation area BA. Therefore, an operation of forming the third through hole 403 in the separation area BA can be performed without adding a separate mask, and thus, the manufacturing cost is reduced.

The third end surface 180a can be exposed through the third through hole 403. This is because the third through hole 403 is formed in the operation of forming the opening H3. In this case, the width of the third through hole 403 can be formed greater than that of the second through hole 402.

That is, the first through hole 401 can be formed to have the smallest width, the second through part 420 can be formed on the first through hole 401, and the third through hole 403 can be formed to have the greatest width. Therefore, the first end surface 160a, the second end surface 170a, and the third end surface 180a can be formed to have a stair structure having a step height. The first end surface 160a can be formed to protrude farther than the second end surface 170a, and the second end surface 170a can be formed to protrude farther than the third end surface 180a. In FIG. 9, a structure in which the first end surface 160a, the second end surface 170a, and the third end surface 180a are formed to have a step height is illustrated, but the described technology is not limited thereto. An end surface of a through hole can have one of the structures of FIGS. 4A to 4C.

Figure 11:
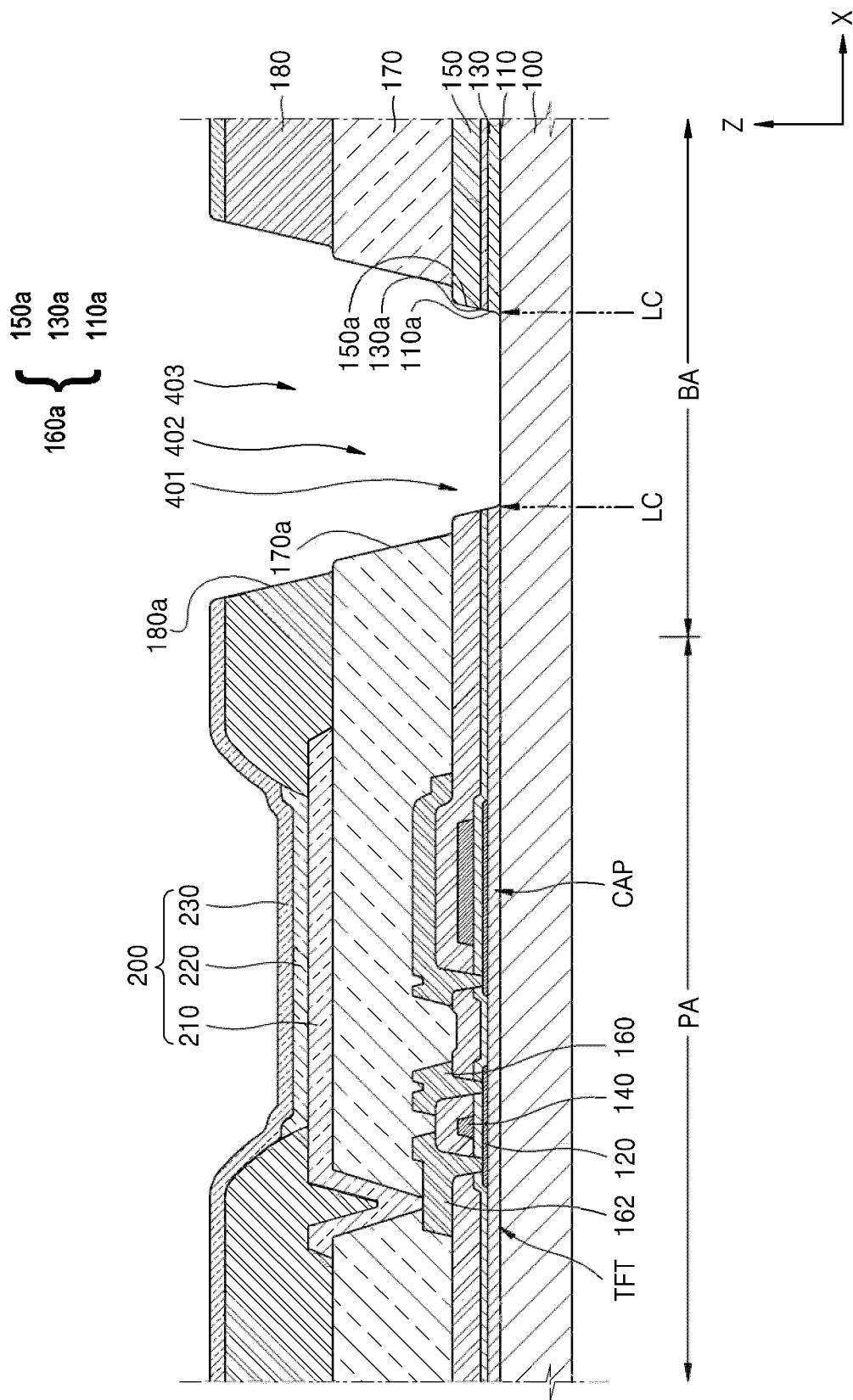

Referring to FIG. 11, the intermediate layer 220 including an emission layer is formed on the pixel electrode 210 exposed by the second insulating layer 180. Subsequently, an operation of forming the opposite electrode 230, which is opposite to the pixels electrode 210, on the second insulating layer 180 to cover the intermediate layer 220 can be performed. The opposite electrode 230 can be formed over the substrate 100. Therefore, although not shown, the opposite electrode 230 can be formed on the first end surface 160a, the second end surface 170a, and the third end surface 180a.

Subsequently, a fourth through hole 404 having a size substantially equal to or less than that of the first through hole 401 can be formed on the substrate 100. The fourth through hole 404 can be formed to pass through the substrate 100. The fourth through hole 404 can be formed by a laser cutting process, and for example, a portion of the substrate 100 can be removed through a fine pattern process using a femto laser.

Figure 12:
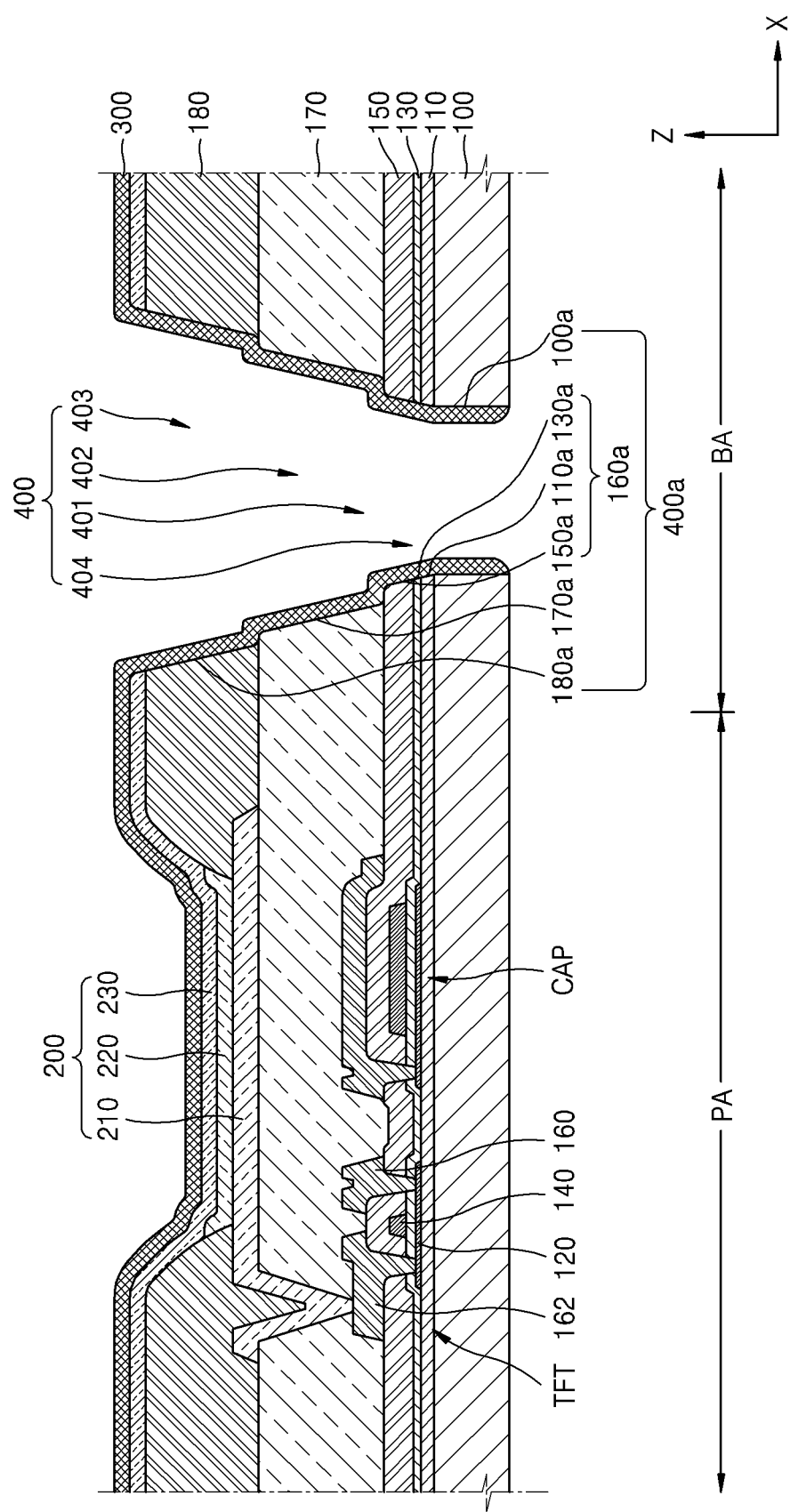

Referring to FIG. 12, a portion of the substrate 100 corresponding to the first through hole 401 is removed, and thus, the fourth through hole 404 is formed. Therefore, the first to fourth through holes 401 to 404 can be formed to overlap each other in the through part 400 which is formed in the separation area BA. Also, a fourth end surface 100a can be exposed by the fourth through hole 404. The first to fourth end surfaces 160a to 100a can be understood as the inner surface 400a of the through part 400.

The inner surface 400a of the through part 400 can be formed in a stair shape to have a step height as illustrated in FIG. 12, and can be formed to have a slope. Also, the inner surface 400a of the through part 400 can be formed in order for a width to be narrowed in a direction from the opposite electrode 230 to the substrate 100. That is, the inner surface 400a of the through part 400 can have a substantially V-shape with a lower end opened.

In FIG. 12, it is illustrated that the opposite electrode 230 is formed on the second insulating layer 180 and is not formed on the first to fourth end surfaces 160a to 100a, but depending on the case, the opposite electrode 230 can be formed all over the substrate 100 without being patterned. Therefore, the opposite electrode 230 can be formed on the inner surface 400a of the through part 400.

An operation of forming the encapsulation layer 300 on the opposite electrode 230 can be performed. Although not shown in FIG. 12, the encapsulation layer 300 can be formed in a multi-layer structure where an organic layer and an inorganic layer are alternately stacked.

The encapsulation layer 300 is formed to seal the OLED and cover the inner surface 400a. When the encapsulation layer 300 is not formed to cover the inner surface 400a of the through part 400, moisture or impurities can flow into one or more material layers in which a cross-sectional surface is exposed due to the inner surface 400a and damage various devices. Therefore, when the encapsulation layer 300 is sealed to cover the inner surface 400a, a reliability of the display device is enhanced.

As described above, according to at least one of the disclosed embodiments, a display device and a method of manufacturing the same which enhance a user's convenience are implemented.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing a display device, the method comprising: providing a substrate including a pixel area and a separation area;
   forming a plurality of pixels in the pixel area, wherein the separation area is located between adjacent pixels;
   forming a plurality of through holes respectively defined by a plurality of surrounding inner surfaces of the separation area, wherein each of the plurality of inner surfaces passes through the substrate, wherein the forming of each through hole of the plurality of through holes comprises forming at least one of the plurality of inner surfaces to have a slope or a step shape in a cross-sectional view; and
   forming an encapsulation layer over the substrate so as to cover the plurality of inner surfaces of each of the plurality of through holes.

2. The method of claim 1, wherein the forming of the plurality of pixels comprises:
   forming a pixel electrode over the substrate;
   forming an intermediate layer including an emission layer over the pixel electrode; and
   forming an opposite electrode at least partially covering the intermediate layer and opposite to the pixel electrode.

3. The method of claim 2, wherein the forming of the plurality of through holes comprises forming at least one of the plurality of surrounding inner surfaces to have a greater width adjacent to the opposite electrode than the substrate.

4. The method of claim 3, further comprising forming a thin film transistor (TFT), including a semiconductor layer and gate, source and drain electrodes, over the substrate,
   wherein the forming of the TFT comprises:
   forming a gate insulating layer between the semiconductor layer and the gate electrode;
   forming an interlayer insulating layer between the gate and source electrodes and between the gate and drain electrodes; and
   forming a contact hole, through which the semiconductor layer is electrically connected to the source and drain electrodes, in the gate and interlayer insulating layers,
   wherein the forming of the plurality of through holes comprises forming first to fourth through holes consecutively, and
   wherein the forming of the contact hole and the forming of the first through hole are concurrently performed.

5. The method of claim 4, further comprising forming a first insulating layer over the TFT, wherein the first insulating layer includes a hole exposing one of the source and drain electrodes of the TFT, and
   wherein the forming of the first insulating layer and the forming of the second through hole are concurrently performed.

6. The method of claim 5, further comprising forming a second insulating layer, including an opening that exposes a center portion of the pixel electrode, over the first insulating layer, wherein the forming of the second insulating layer and the forming of the third through hole are concurrently performed.

7. The method of claim 6, wherein the forming of the fourth through hole comprises removing a portion of the substrate corresponding to the first through hole.

8. The method of claim 1, wherein at least one of the through plurality of through holes is formed between four adjacent pixels.

9. A method of manufacturing a display device, the method comprising: providing a substrate including a pixel area and a separation area;
   forming a plurality of pixels in the pixel area, wherein the separation area is located between adjacent pixels, wherein the forming of the plurality of pixels comprises:
   forming a pixel electrode over the substrate;

forming an intermediate layer including an emission layer over the pixel electrode; and forming an opposite electrode at least partially covering the intermediate layer and opposite to the pixel electrode;

forming a thin film transistor (TFT), including a semiconductor layer and gate, source and drain electrodes, over the substrate, wherein the forming of the TFT comprises:

forming a gate insulating layer between the semiconductor layer and the gate electrode;

forming an interlayer insulating layer between the gate and source electrodes and between the gate and drain electrodes; and forming a contact hole, through which the semiconductor layer is electrically connected to the source and drain electrodes, in the gate and interlayer insulating layers;

forming a plurality of through holes respectively defined by a plurality of surrounding inner surfaces of the separation area, wherein each of the plurality of inner surfaces passes through the substrate, wherein the forming of the plurality of through holes comprises forming at least one of the plurality of surrounding inner surfaces to have a greater width adjacent to the opposite electrode than the substrate; and forming an encapsulation layer over the substrate so as to cover the plurality of inner surfaces of each of the plurality of through holes, wherein the forming of the plurality of through holes comprises forming first to fourth through holes consecutively, and wherein the forming of the contact hole and the forming of the first through hole are concurrently performed.

* * * * *